United States Patent
Joshi et al.

(10) Patent No.: US 6,794,580 B2
(45) Date of Patent: Sep. 21, 2004

(54) SOLDER INTERCONNECTIONS FOR FLAT CIRCUITS

(75) Inventors: Prashant P. Joshi, Auburn Hills, IL (US); Robert M. Fuerst, West Bloomfield, MI (US)

(73) Assignee: Molex Incorporated, Lisle, IL (US)

( * ) Notice: Subject to any disclaimer, the term of this patent is extended or adjusted under 35 U.S.C. 154(b) by 11 days.

(21) Appl. No.: 10/079,340

(22) Filed: Feb. 20, 2002

(65) Prior Publication Data

US 2004/0055784 A1 Mar. 25, 2004

(51) Int. Cl.[7] .................................................. H05K 1/02
(52) U.S. Cl. ...................... 174/254; 174/261; 361/784; 361/803
(58) Field of Search ................................. 174/254, 261, 174/255, 256; 361/792, 803, 784; 29/830

(56) References Cited

U.S. PATENT DOCUMENTS

| | | | | |
|---|---|---|---|---|
| 5,764,497 A | * | 6/1998 | Mizumo | ................... 361/792 |
| 6,213,786 B1 | * | 4/2001 | Matsui et al. | ................ 361/784 |
| 6,223,973 B1 | * | 5/2001 | Wong et al. | ................. 361/803 |
| 6,226,862 B1 | * | 5/2001 | Neuman | ....................... 29/830 |

FOREIGN PATENT DOCUMENTS

JP 403101190 * 4/1991 .................. 29/830

* cited by examiner

*Primary Examiner*—Albert W. Paladini
(74) *Attorney, Agent, or Firm*—Stacey E. Caldwell

(57) ABSTRACT

A system and method are provided for facilitating the interconnection of the conductors of a flat circuit. A flat circuit substrate is provided with a plurality of conductors thereon. A dielectric film on the substrate substantially covers the conductors. An opening is formed in the film to selectively expose the conductors. A layer of solder material is preapplied to the exposed conductors in the opening. Therefore, the opening can be juxtaposed with a mating conductor to facilitate interconnecting the conductors by an appropriate soldering process using the preapplied solder material.

32 Claims, 4 Drawing Sheets

SOLDER INTERCONNECTIONS FOR FLAT CIRCUITS

FIELD OF THE INVENTION

This invention generally relates to the art of electrical interconnections and, particularly, to a system for facilitating the interconnection of the conductors of flat circuits, such as flat flexible circuits, along with a method of fabricating such flat circuits.

BACKGROUND OF THE INVENTION

A flat flexible circuit conventionally includes an elongated flat flexible dielectric substrate having laterally spaced, generally parallel strips or conductors on one or both sides thereof. The conductors typically are covered with a thin, flexible protective layer or film on one or both sides of the circuit. If films are used on both sides, the film on one side forms the substrate. Cutouts or openings are formed in the top film to expose the underlying conductors typically at the end of the circuit where the conductors are to engage the conductors or terminals of a complementary mating connecting device which may be a second flat flexible circuit, a printed circuit board, discrete electrical wires or the terminals of a mating connector.

These preformed flat circuits, with their cutouts or openings to expose the conductors, then are transferred or transported to other locations where the conductors are interconnected to the conductors or terminals of the complementary mating connecting device by soldering processes. During soldering, solder material is added to permanently interconnect the conductors of the flat circuit to the conductors of the mating connecting device. The preformed flat circuits may be transferred to inventory and subsequently transported to the manufacturing, interconnecting or soldering processing locations.

Problems are encountered in the fabrication and interconnection procedures of the prior art as described above. For instance, applying solder material to the conductors of the flat circuits in the processing operations are very expensive and difficult to control. Skipped or insufficient solder material could lead to quality disasters. It is very difficult and expensive to inspect the quality of solder joints involving flat circuits, particularly when a flat circuit is interconnected to a second flat circuit at a "lap solder joint". The present invention is directed to solving these problems by incorporating the application of the solder material in the primary fabrication process of the flat circuits and, thereby, assuring proper solder material presence prior to the actual soldering process.

SUMMARY OF THE INVENTION

An object, therefore, of the invention is to provide a new system for facilitating the interconnection of the conductors of a flat circuit, such as interconnecting the conductors of a pair of flat circuits.

Another object of the invention is to provide a new method of fabricating and interconnecting the conductors of a pair of flat circuits.

A further object of the invention is to provide a new method of fabricating a flat circuit.

In the exemplary embodiments of the invention, a flat circuit, such as a flat flexible circuit, is provided with a plurality of conductors covered by a dielectric film. An opening is formed in the film to selectively expose the conductors. A layer of solder material is applied on the exposed conductors in the opening. Therefore, the opening can be juxtaposed with a mating conductor to facilitate interconnecting the conductors by an appropriate soldering process using the preapplied solder material.

According to the invention, a second flat circuit may be provided with a plurality of conductors covered by a dielectric film, with an opening in the film to selectively expose the conductors. A layer of solder material is applied on the exposed conductors in the opening of the second flat circuit. The two flat circuits can be overlapped with the openings in the respective dielectric films thereof in juxtaposition. The conductors of the two circuits then can be easily soldered through the juxtaposed openings using the preapplied solder material on the conductors of both flat circuits.

According to various aspects of the invention, the opening in the dielectric film of the preformed flat circuit can be located at a distal end of the circuit, or spaced inwardly from the distal end. The opening may comprise a window surrounded by the film. In fact, a plurality of the windows can be provided in a predetermined pattern in the film. In all of these embodiments, electrically interconnecting the flat circuit is facilitated by having solder material preapplied to the conductors within the film opening(s) regardless of the location thereof.

According to another aspect of the invention, the solder material may comprise a layer of solder covered by a layer of flux. The solder and flux layers are preapplied to the conductors within the openings in the dielectric film of the flat circuit. The flat circuit may be a flexible flat circuit using a thin, flexible protective film on both sides of the circuit.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
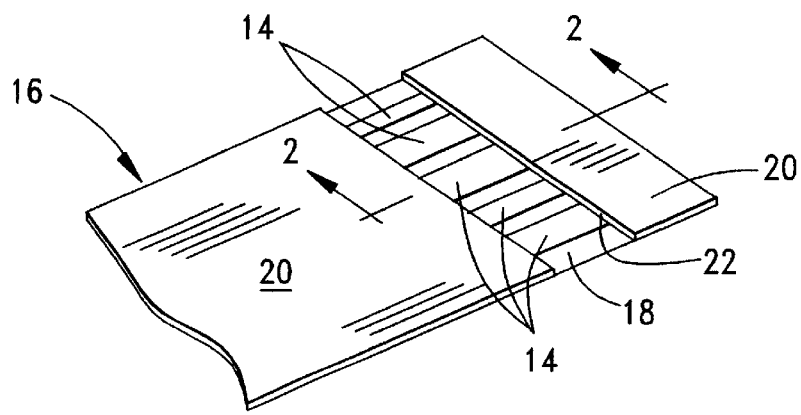
FIG. 1 is fragmented perspective view of a flat circuit according to the invention.
Figure 2:
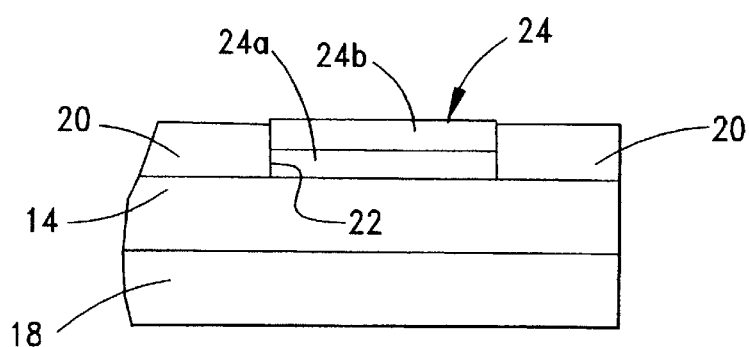
FIG. 2 is an enlarged section taken generally along line 2—2 of FIG. 1.

Referring to the drawings in greater detail, and first to the embodiment of FIGS. 1 and 2, the invention is directed to a system for facilitating the electrical interconnection of a plurality of conductors 14 of a flat circuit, generally designated 16, such as a flat flexible circuit. In the illustrated embodiment, conductors 14 are laterally spaced, generally parallel strips of thin metal material deposited on or laminated to a circuit substrate 18. A thin flexible protective layer or film 20 covers the conductors on the substrate. Flat circuit 16 may be a flat flexible circuit which, in that instance, substrate 18 will be a second or bottom thin, flexible protective layer or film. The film or films may be fabricated of dielectric material such as polyester or the like.

The invention contemplates forming one or more openings 22 in protective dielectric film 20 to selectively expose conductors 14 within the opening, as best seen in FIG. 1. A layer of solder material, generally designated 24 in FIG. 2, is applied respectively onto each conductor 14 within opening 22. In the illustrated embodiment, solder material 24 includes a bottom solder layer 24a and a top flux layer 24b.

Solder layer 24 may be a variety of eutectic metals or alloys such as a tin/lead alloy or even pure tin material. Flux layer 24b may be a variety of substances or mixtures used to promote the fusion of the metal materials in a soldering process, such as alkalis, borax, rosin or the like. However, it should be understood that the term "solder material" 24 as used herein is not intended to be limited to discrete layers of materials such as the solder layer and flux layer shown herein. These materials may be embodied in a single homogeneous or composite layer or the flux layer might be completely eliminated. In any event, solder material 24 is preapplied onto exposed conductors 14 during the fabrication of flat circuit 16 prior to the interconnection or soldering processes. With the system of the invention, the amount or quality of the solder material application is very easy to verify or inspect, which has been extremely difficult, if at all possible, in prior art systems where the solder material is added during the soldering processes. In fact, it is contemplated that the solder material can be of a definitive color which would readily show its presence and/or quantity.

Figure 3:
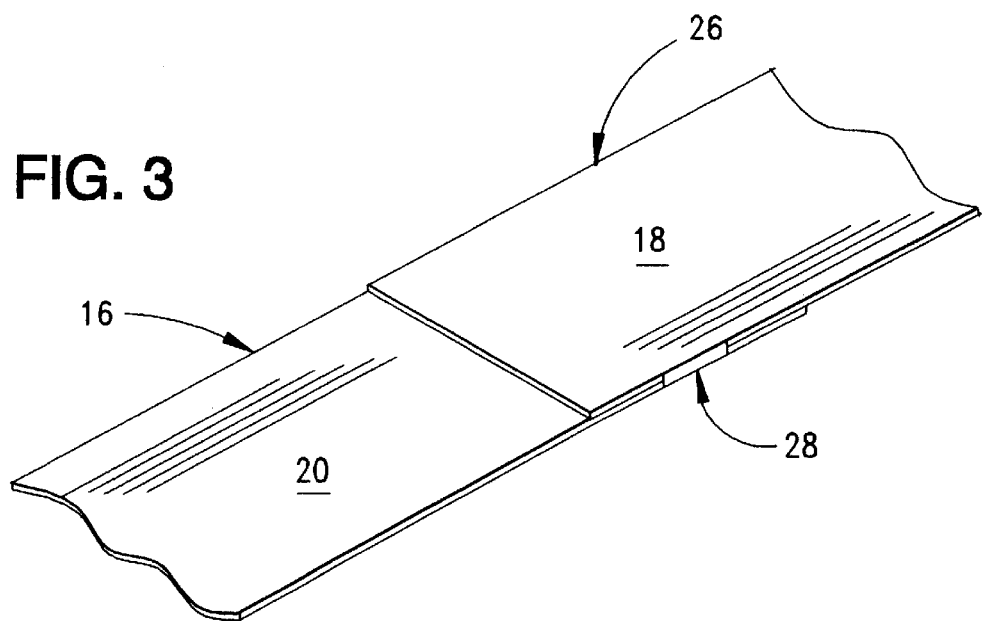
FIG. 3 is a fragmented perspective view of the flat circuit of FIG. 1 electrically interconnected to a second flat circuit at a lap joint.

Once flat circuit 16 is fabricated or prepared according to the system or method described above in relation to FIGS. 1 and 2, conductors 14 can be readily interconnected by soldering to the conductors or terminals of a complementary mating connecting device which may be a second flat circuit, a printed circuit board, discrete electrical wires or the terminals of a mating connector. For instance, in FIG. 3, a second flat flexible circuit, generally designated 26, may be fabricated similar to first flat circuit 16 and solder connected thereto at a lap solder joint, generally designated 28. In other words, the openings 22 of the two overlapped circuits can be juxtaposed to juxtapose the respective conductors 14 of the two overlapped flat circuits. The conductors then are electrically interconnected by an appropriate heating process using the preapplied solder material 24 on the conductors within the juxtaposed openings of the two circuits.

Figure 4:
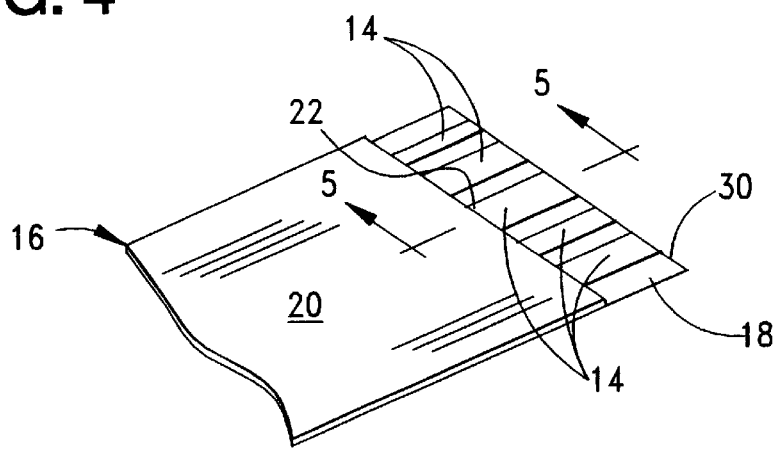
FIGS. 4–6 are views similar to that of FIGS. 1–3, respectively, but of a second embodiment of the invention.
Figure 5:
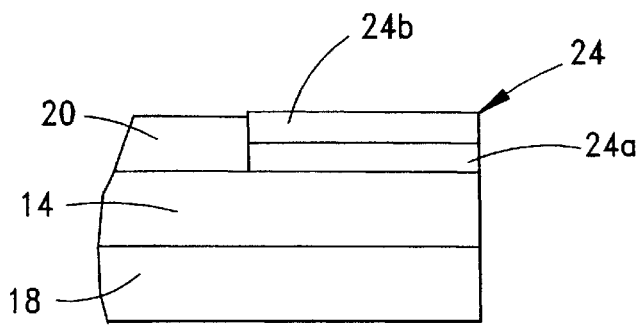
Figure 6:
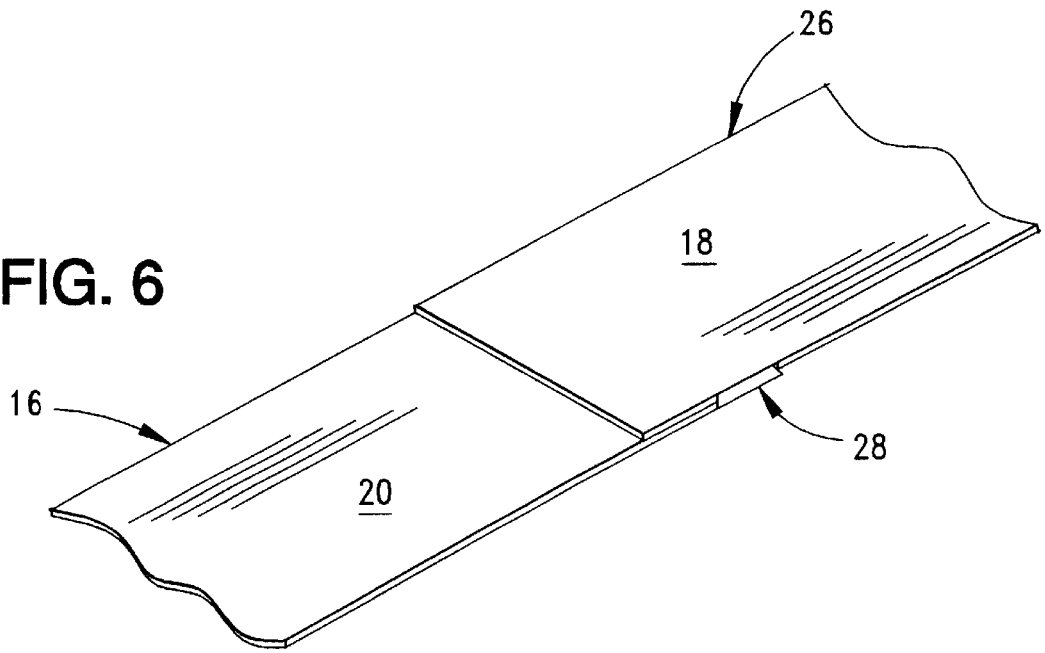

FIGS. 4–6 show a second embodiment of the invention which incorporates the same system and method described above in relation to the embodiment of FIGS. 1–3. Consequently, like numerals have been applied in FIGS. 4–6 corresponding to like components described above in relation to FIGS. 1–3. Suffice it to say, in the second embodiment of FIGS. 4–6, opening 22 is formed in film 20 of flat circuit 16 immediately at the free or distal end 30 of the circuit. Again, solder material 24 is preapplied on top of exposed conductors 14 within opening 22 in film 20 to facilitate electrically interconnecting the conductors to the conductors of second flat circuit 26.

In the remaining embodiments of FIGS. 7–12, like reference numerals again will be applied to like components described above in relation to the first and second embodiments in FIGS. 1–6. For instance, a first flat circuit 16 is electrically interconnected to a second flat circuit 26.

Figure 7:
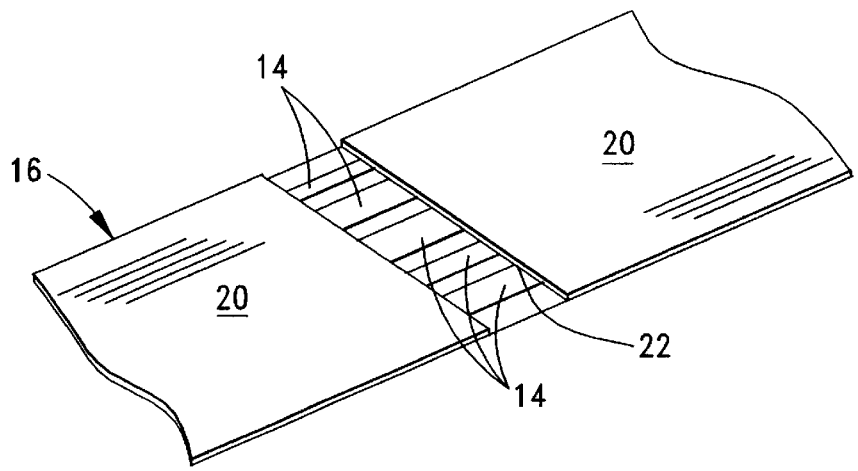
FIGS. 7 and 8 are perspective views similar to that of FIGS. 1 and 3, respectively, but of a third embodiment of the invention.
Figure 8:
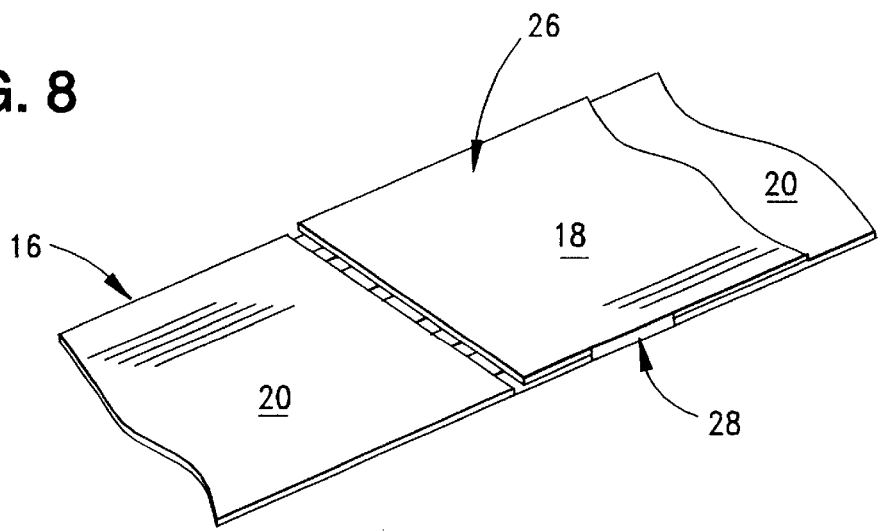

With that understanding, and referring to FIG. 7, first flat circuit 16 is relatively long, and opening 22 is formed across the width of the circuit considerably remote from any ends of the circuit. Nevertheless, conductors 14 are exposed within opening 22, and solder material 24 FIGS. 2 and 5) is preapplied onto the exposed conductors. Flat circuit 16 then can be easily electrically connected by soldering processes to second flat circuit 26 (FIG. 8) at lap solder joint 28.

Figure 9:
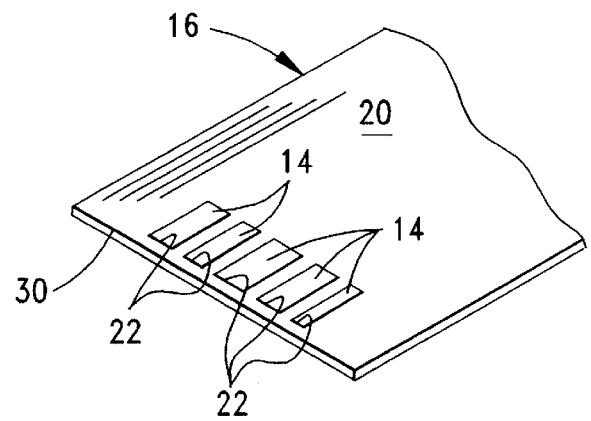
FIGS. 9 and 10 are perspective views similar to that of FIGS. 1 and 3, respectively, but of a fourth embodiment of the invention.
Figure 10:
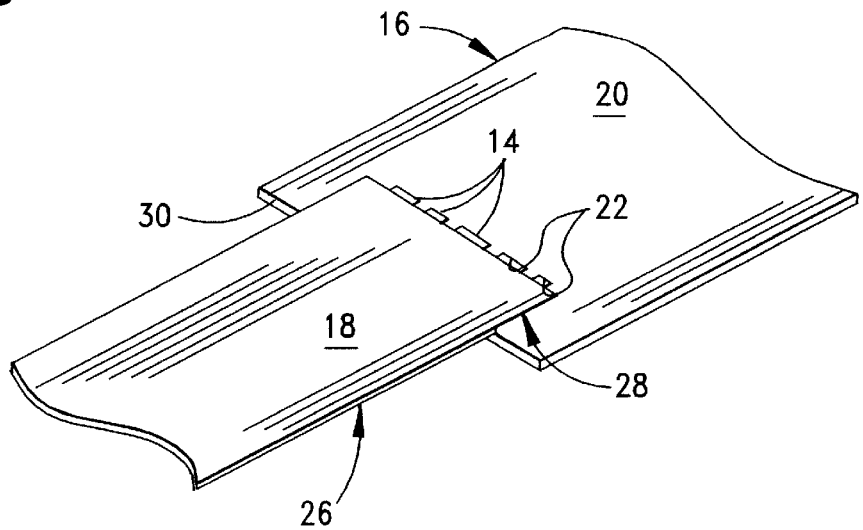

In the fourth embodiment of FIGS. 9 and 10, first flat circuit 16 includes a plurality of openings 22 close to a distal end 30 of the circuit. The individual conductors 14 are exposed respectively within the individual openings, and solder material 24 (FIGS. 2 and 5) is preapplied on the conductors within the openings. Second flat circuit 26 in FIG. 10 can be fabricated similar to first flat circuit 16 of the second embodiment in FIG. 4 and electrically connected to the first flat circuit at a lap solder joint 28 as seen in FIG. 10, with the second flat circuit projecting away from the distal end of the first flat circuit.

Figure 11:
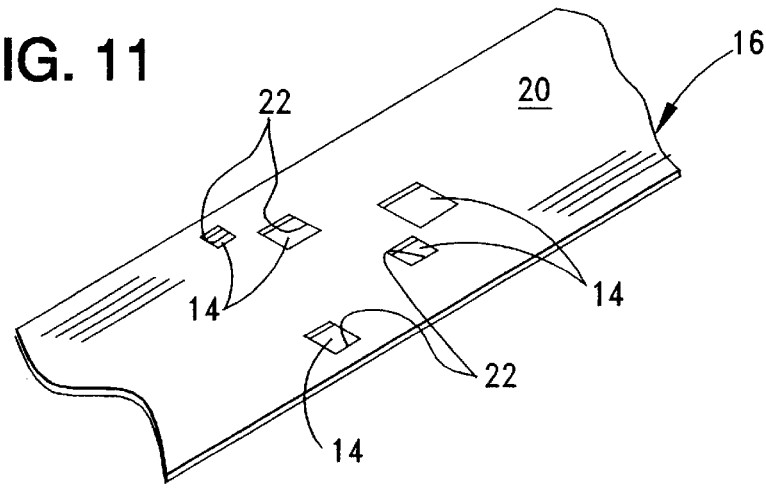
FIGS. 11 and 12 are perspective views similar to that of FIGS. 1 and 3, respectively, but of a fifth embodiment of the invention.
Figure 12:
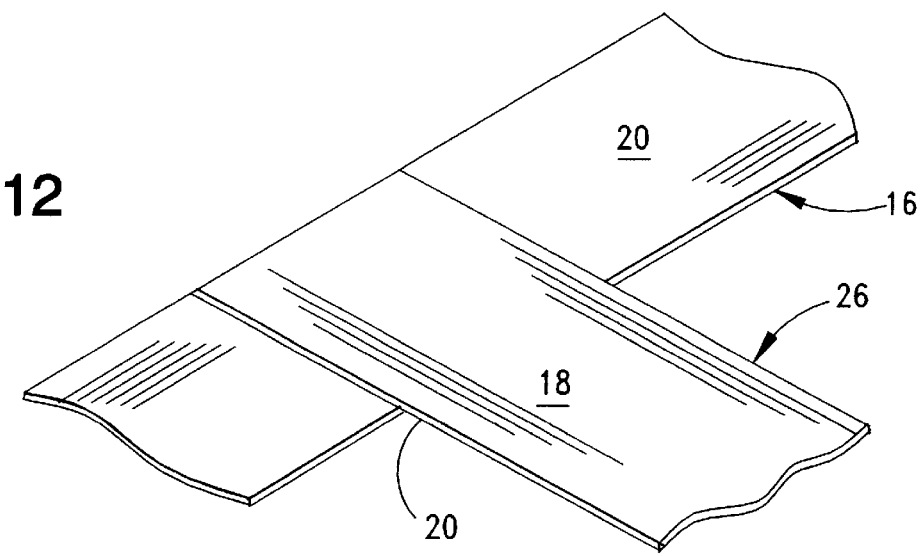

Finally, in the fifth embodiment of FIGS. 11 and 12, a plurality of openings 22 are formed in film 22 of first flat circuit 16 in an irregular pattern to expose conductors 14 therewithin at different longitudinal spacings thereof. Nevertheless, solder material 24 (FIGS. 2 and 5) again is preapplied to the conductors within the openings. Second flat circuit 26 in FIG. 12 will have a similar pattern of openings in film 20 thereof, although the openings in the second flat circuit are not visible in the drawings. It can be seen that second flat circuit 26 projects generally perpendicular to first flat circuit 16. When the two circuits are overlapped as shown in FIG. 12, the irregular pattern of windows are juxtaposed to juxtapose the exposed conductors of the respective circuits as well as the preapplied solder material thereon. These irregular patterns of openings allow the conductors of the respective circuits to be interconnected notwithstanding the mutually perpendicular orientation of the circuits.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A system for facilitating the interconnection of the conductors of a pair flat circuits, comprising:

a first flat circuit having a plurality of conductors covered by a dielectric film, with an opening in the film to selectively expose the conductors, and a layer of solder material on the exposed conductors in the opening; and a second flat circuit having a plurality of conductors covered by a dielectric film, with an opening in the film to selectively expose the conductors, and a layer of solder material on the exposed conductors in the opening;

whereby said openings can be juxtaposed with the flat circuits overlapping each other to facilitate interconnecting the conductors of the two flat circuits by an appropriate soldering process using the preapplied solder material.

2. The system of claim 1 wherein the opening in the dielectric film of at least one of the flat circuits is located at a distal end of the circuit.

3. The system of claim 1 wherein the opening in the dielectric film of at least one of the flat circuits spans a width of the circuit spaced inwardly from a distal end thereof.

4. The system of claim 1 wherein the opening in the dielectric film of at least one of the flat circuits comprises a window surrounded by the film.

5. The system of claim 4, including a plurality of said windows in a predetermined pattern in the film.

6. The system of claim 1 wherein said solder material comprises a layer of solder covered by a layer of flux.

7. The system of claim 1 wherein at least one of said flat circuits comprises a flat flexible circuit.

8. The system of claim 7 wherein said flat flexible circuit includes a flat flexible substrate having the conductors and dielectric film laminated thereto.

9. A system for facilitating the interconnection of the conductors of a flat circuit, comprising:
   a flat circuit substrate;
   a plurality of conductors on the substrate;
   a dielectric film on the substrate substantially covering the conductors, with an opening in the film to selectively expose at least one of the conductors; and
   a layer of solder material on the exposed conductor in the opening,
   whereby said opening can be juxtaposed with a mating conductor to facilitate interconnecting the conductors by an appropriate soldering process using the preapplied solder material.

10. The system of claim 9 wherein the opening in the dielectric film is located at a distal end of the circuit.

11. The system of claim 9 wherein the opening in the dielectric film spans a width of the circuit spaced from a distal end thereof.

12. The system of claim 9 wherein the opening in the dielectric film comprises a window surrounded by the film.

13. The system of claim 12, including a plurality of said windows in a predetermined pattern in the film.

14. The system of claim 9 wherein said solder material comprises a layer of solder covered by a layer of flux.

15. The system of claim 9 wherein said flat circuit substrate is flexible.

16. The system of claim 15 wherein said flat flexible circuit substrate comprises a second dielectric film.

17. A method of fabricating and interconnecting the conductors of a pair of flat circuits, comprising the steps of:
   providing a first flat circuit having a plurality of conductors covered by a dielectric film;
   forming an opening in the film to selectively expose at least some of the conductors;
   applying a layer of solder material on the exposed conductors in the opening;
   providing a second flat circuit having a plurality of conductors covered by a dielectric film;
   forming an opening in the film of the second flat circuit to selectively expose at least some of the conductors thereof;
   applying a layer of solder material on the exposed conductors of the second flat circuit in the opening thereof;
   overlapping the flat circuits with the openings in the respective dielectric films thereof in juxtaposition; and
   soldering the conductors of the second flat circuit through the juxtaposed openings using the preapplied solder material.

18. The method of claim 17 including forming the opening in the dielectric film of at least one of the flat circuits at a distal end of the circuit.

19. The method of claim 17 including forming the opening in the dielectric film of at least one of the flat circuits spanning a width of the circuit spaced inwardly from a distal end thereof.

20. The method of claim 17 including forming the opening in the dielectric film of at least one of the flat circuits as a window surrounded by the film.

21. The method of claim 20 including forming a plurality of said windows in a predetermined pattern in the film of the at least one flat circuit.

22. The method of claim 17 including providing said solder material with a layer of solder covered by a layer of flux.

23. The method of claim 17 including providing at least one of said flat circuits as a flat flexible circuit.

24. The method of claim 23 including providing said flat flexible circuit with a flat flexible substrate having the conductors and dielectric film laminated thereto.

25. A method of fabricating a flat circuit, comprising the steps of:
   providing a flat circuit substrate with a plurality of conductors thereon and covered by a dielectric film;
   forming an opening in the film to selectively expose at least some of the conductors;
   applying a layer of solder material on the exposed conductors in the opening;
   whereby said opening can be juxtaposed with a mating conductor to facilitate interconnecting the conductors by an appropriate soldering process using the preapplied solder material.

26. The system of claim 25 including forming the opening in the dielectric film at a distal end of the circuit.

27. The system of claim 25 including forming the opening in the dielectric film to span a width of the circuit spaced from a distal end thereof.

28. The system of claim 25 including forming the opening in the dielectric film as a window surrounded by the film.

29. The system of claim 28 including forming a plurality of said windows in a predetermined pattern in the film.

30. The system of claim 25 including providing said solder material with a layer of solder covered by a layer of flux.

31. The system of claim 25 including providing said flat circuit substrate as a flexible substrate.

32. The system of claim 31 including providing said flat flexible circuit substrate as a second dielectric film.

* * * * *